(12) United States Patent
Mori et al.

(10) Patent No.: US 7,276,683 B2
(45) Date of Patent: Oct. 2, 2007

(54) SOLID-STATE IMAGING DEVICE AND RADIATION IMAGING SYSTEM

(75) Inventors: Harumichi Mori, Hamamatsu (JP); Kazuki Fujita, Hamamatsu (JP); Ryuji Kyushima, Hamamatsu (JP); Masahiko Honda, Hamamatsu (JP)

(73) Assignee: Hamamatsu Photonics K.K., Shizuoka (JP)

( * ) Notice: Subject to any disclaimer, the term of this patent is extended or adjusted under 35 U.S.C. 154(b) by 0 days.

(21) Appl. No.: 10/536,319

(22) PCT Filed: Nov. 26, 2003

(86) PCT No.: PCT/JP03/15108

§ 371 (c)(1),
(2), (4) Date: Nov. 10, 2005

(87) PCT Pub. No.: WO2004/049447

PCT Pub. Date: Jun. 10, 2004

(65) Prior Publication Data

US 2006/0138337 A1    Jun. 29, 2006

(51) Int. Cl.
*H01L 27/00*    (2006.01)
*H01L 31/00*    (2006.01)
*G01T 1/24*    (2006.01)

(52) U.S. Cl. .............. 250/208.1; 250/214.1; 250/370.11; 257/443; 348/302

(58) Field of Classification Search ........... 250/208.1, 250/214.1, 370.11, 370.14; 348/302, 303, 348/308, 320, 241; 257/291, 292, 443
See application file for complete search history.

(56) References Cited

U.S. PATENT DOCUMENTS

2002/0145117 A1*    10/2002    Mochizuki ............ 250/370.09

FOREIGN PATENT DOCUMENTS

| EP | 1 049 171 A1 | 11/2000 |
|----|---|---|
| EP | 1 173 007 A2 | 1/2002 |
| EP | 1 246 250 A2 | 10/2002 |
| JP | 09-238287 | 9/1997 |
| WO | WO 00/26966 | 5/2000 |

* cited by examiner

*Primary Examiner*—Kevin Pyo
(74) *Attorney, Agent, or Firm*—Drinker Biddle & Reath LLP (57) ABSTRACT

N$^+$-type semiconductor regions 12$d$ are formed on a front surface side of a p$^-$-type layer 12$c$ of a semiconductor substrate 12, and these n$^+$-type semiconductor and p$^-$-type semiconductor constitute photodiodes. A metal wire 14 connected to an isolation region 12$e$ is formed on a first insulating layer 13. The metal wire 14 is provided so as to extend along a row direction and along a column direction between adjacent n$^+$-type semiconductor regions 12$d$, and is of grid shape when viewed from a direction of incidence of light. Signal readout lines 53 are formed on a third insulating layer 16. The signal readout lines 53 are made of metal such as aluminum, are located above the n$^+$-type semiconductor regions 12$d$ when viewed from the direction of incidence of light, and are provided so as to extend along the column direction.

5 Claims, 7 Drawing Sheets

SOLID-STATE IMAGING DEVICE AND RADIATION IMAGING SYSTEM

This application claims the benefit of a national stage of PCT/JP03/15108 filed on Sep. 26, 2003.

TECHNICAL FIELD

The present invention relates to a solid-state imaging apparatus and a radiographic imaging apparatus.

BACKGROUND ART

An example of the known solid-state imaging apparatus of this type is one having a plurality of photoelectric converters arrayed in a matrix of M rows and N columns on a substrate, and signal readout lines (signal lines) for readout of signals from the respective photoelectric converters (e.g., reference is made to Patent Document 1). The signal readout lines are provided so as to extend along the direction of columns and between adjacent photoelectric converters.

[Patent Document 1] PCT International Publication WO00/26966

DISCLOSURE OF THE INVENTION

In the configuration of the conventional technology, however, each signal readout line (signal line) comes to have a capacitance (parasitic capacitance) with respect to an electrically conductive material located between adjacent photoelectric converters (e.g., a gate line connecting a control terminal of each gate switch connected to the signal line, to a vertical shift register; a metal wire for giving a predetermined potential (including the ground potential) to an isolation region formed between adjacent photoelectric converters). The parasitic capacitance poses a problem of noise generation. Particularly, in a case where an image detecting area has a large area, the length of the signal line itself becomes long, so as to increase the parasitic capacitance as well, so that noise becomes more likely to be generated.

The present invention has been accomplished in view of the above point and an object of the invention is to provide a solid-state imaging apparatus and a radiographic imaging apparatus capable of reducing the parasitic capacitance of signal lines for readout of signal outputs from photoelectric converters and thereby suppressing generation of noise.

A solid-state imaging apparatus according to the present invention comprises: a plurality of photoelectric converters arrayed in a two-dimensional pattern; and signal lines for reading out outputs from the photoelectric converters, which are electrically connected to the photoelectric converters, wherein the signal lines are located above the photoelectric converters.

In the solid-state imaging apparatus according to the present invention, the signal lines for readout of outputs from the photoelectric converters are located above the photoelectric converters, and thus are apart from portions between adjacent photoelectric converters. For this reason, the parasitic capacitance of the signal lines is reduced, so that the generation of noise can be suppressed.

Preferably, the signal lines are provided for respective columns of the photoelectric converters and extend along a direction of each column; the solid-state imaging apparatus further comprises a switch group consisting of a plurality of switches for controlling electrical connection and disconnection between each photoelectric converter and the signal line in each column of the photoelectric converters, and wires connected to control terminals of the respective switches constituting the switch group and arranged to supply to the control terminals a scan signal to turn each switch off or on in each row of the photoelectric converters; the wires are provided so as to extend along a direction of rows of the photoelectric converters and between the photoelectric converters adjacent to each other.

Another solid-state imaging apparatus according to the present invention comprises: a plurality of photoelectric converters arrayed in a matrix of M rows and N columns; first wires provided for the respective columns; a first switch group consisting of a plurality of switches connecting between each photoelectric converter and the first wire in each column; a vertical shift register for outputting a vertical scan signal to open and close each switch forming the first switch group, in each row; second wires for connecting between a control terminal of each switch forming the first switch group, and the vertical shift register in each row; a second switch group consisting of a plurality of switches connecting between each first wire and a signal output line; and a horizontal shift register for outputting a horizontal scan signal to open and close each switch forming the second switch group, in each column, wherein the first wires are located above the photoelectric converters and provided so as to extend along a direction of the columns, and wherein the second wires are provided so as to extend along a direction of the rows and between the photoelectric converters adjacent to each other.

In the solid-state imaging apparatus according to the present invention, the first wires for readout of signal outputs from the photoelectric converters are located above the photoelectric converters, and thus are apart from portions between adjacent photoelectric converters. For this reason, the parasitic capacitance of the first wires is reduced, so that the generation of noise can be suppressed.

A radiographic imaging apparatus according to the present invention comprises the foregoing solid-state imaging apparatus; and a scintillator for converting radiation to visible light, which is provided so as to cover the plurality of photoelectric converters.

In the radiographic imaging apparatus according to the present invention, as described above, the parasitic capacitance of the signal lines in the solid-state imaging apparatus is reduced, so that the generation of noise can be suppressed in similar fashion.

BEST MODE FOR CARRYING OUT THE INVENTION

A preferred embodiment of the present invention will be described below in detail with reference to the drawings. Identical elements or elements with identical functionality will be denoted by the same reference symbols in the description, without redundant description. A radiographic imaging apparatus according to the present embodiment incorporates a solid-state imaging apparatus (solid-state image sensor) according to an embodiment of the present invention.

Figure 1:
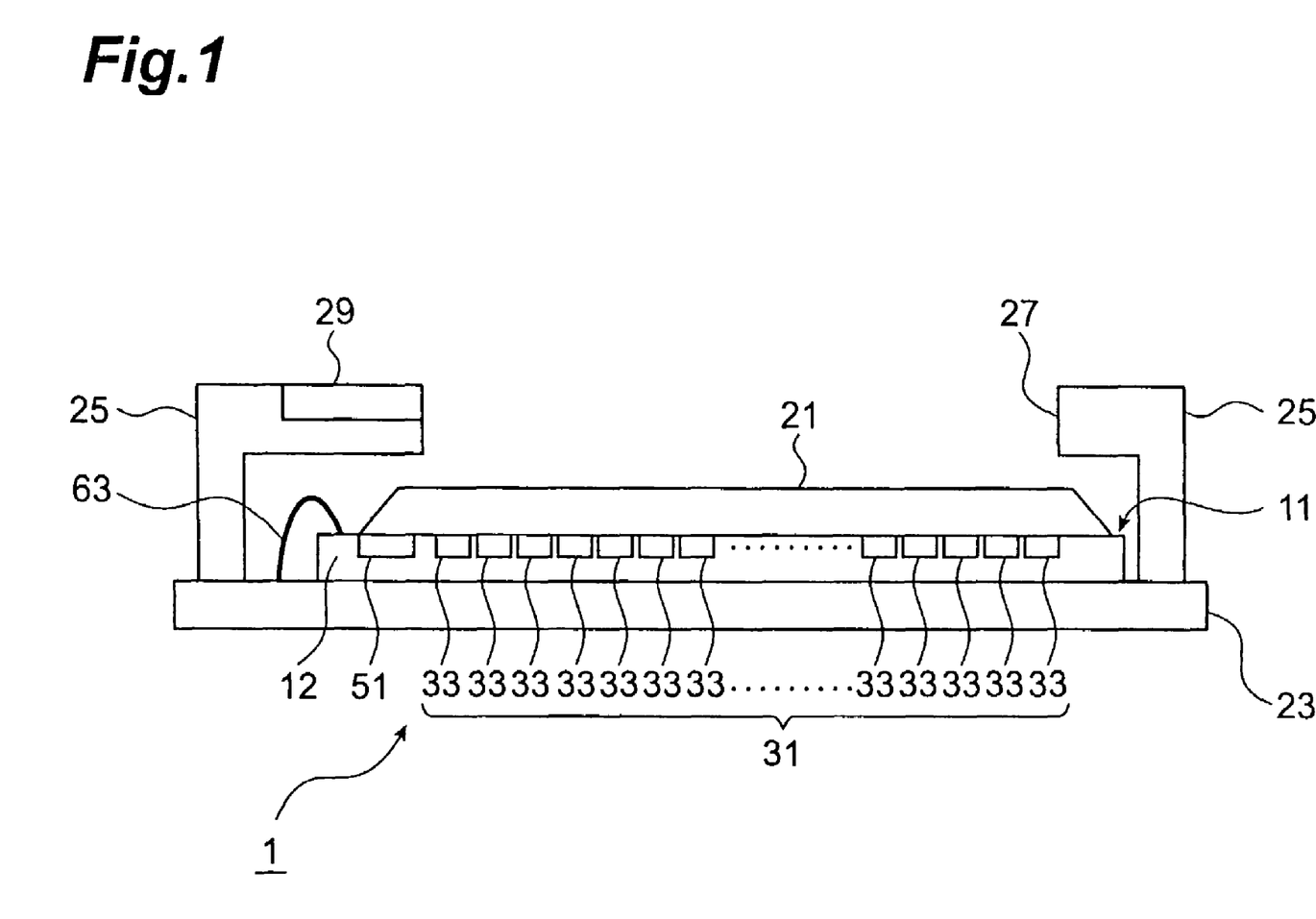
FIG. 1 is a schematic view for explaining a cross-sectional configuration of a radiographic imaging apparatus according to an embodiment of the present invention.
Figure 2:
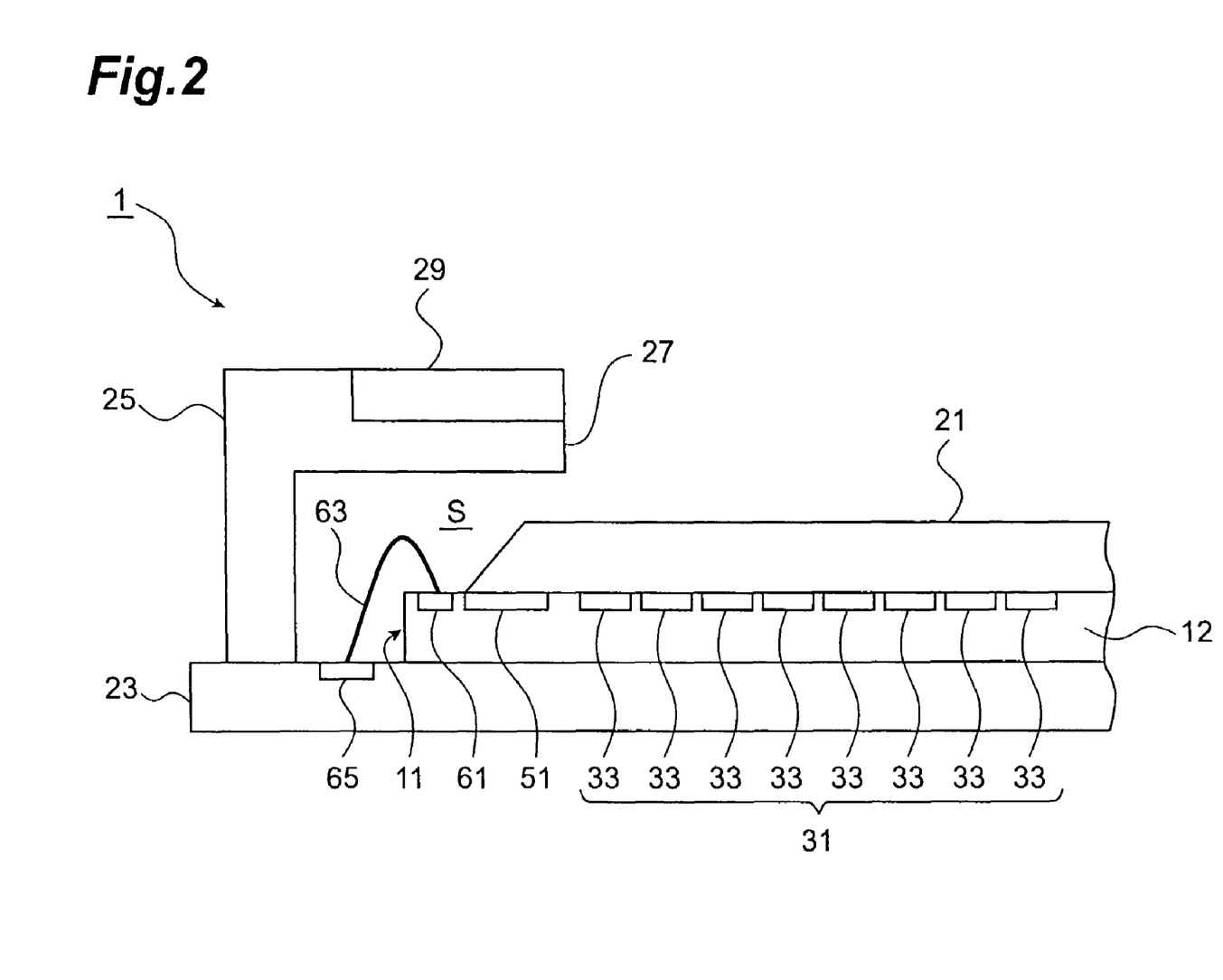
FIG. 2 is a schematic view for explaining the cross-sectional configuration of the radiographic imaging apparatus according to the embodiment of the present invention.
Figure 3:
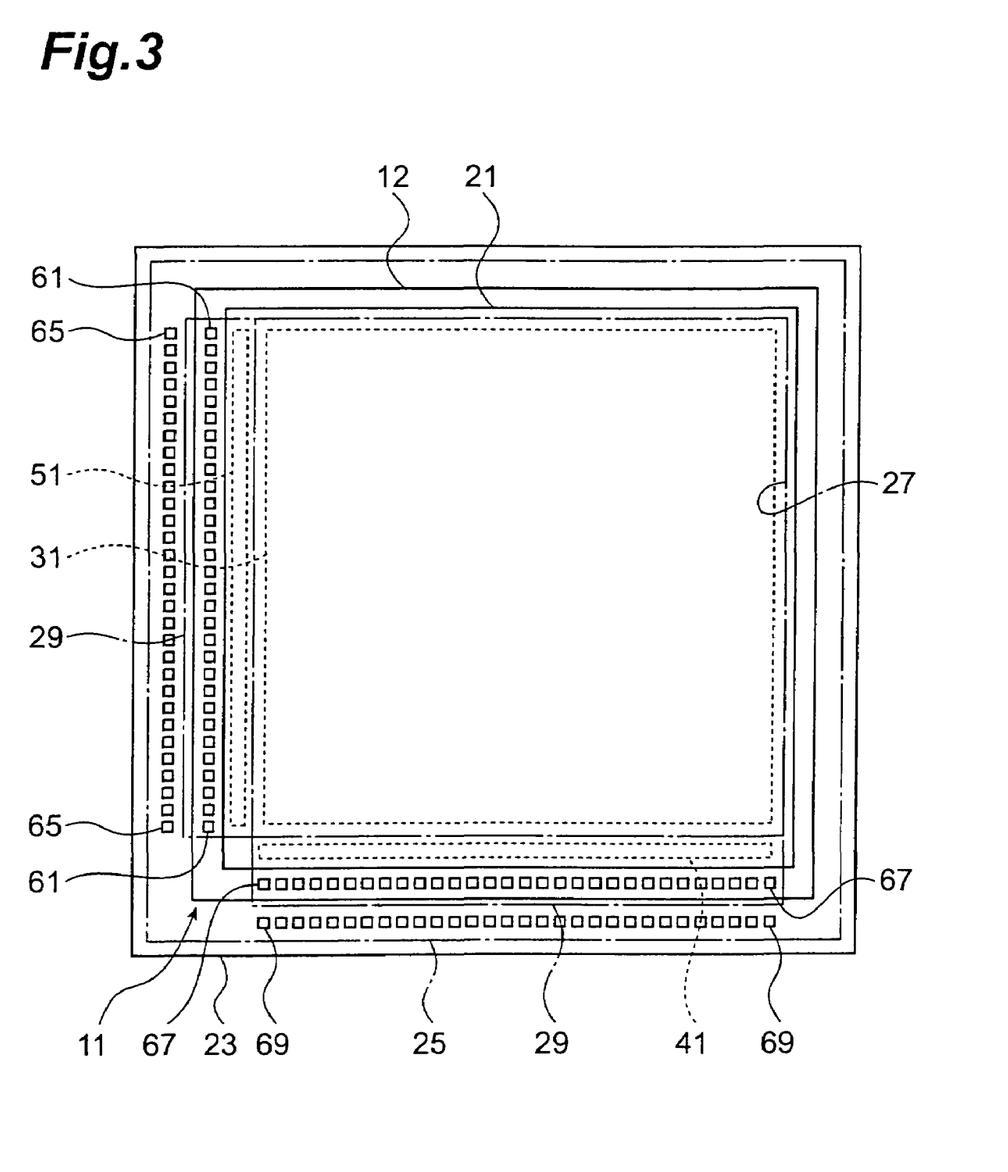
FIG. 3 is a plan view showing the radiographic imaging apparatus according to the embodiment of the present invention.
Figure 4:
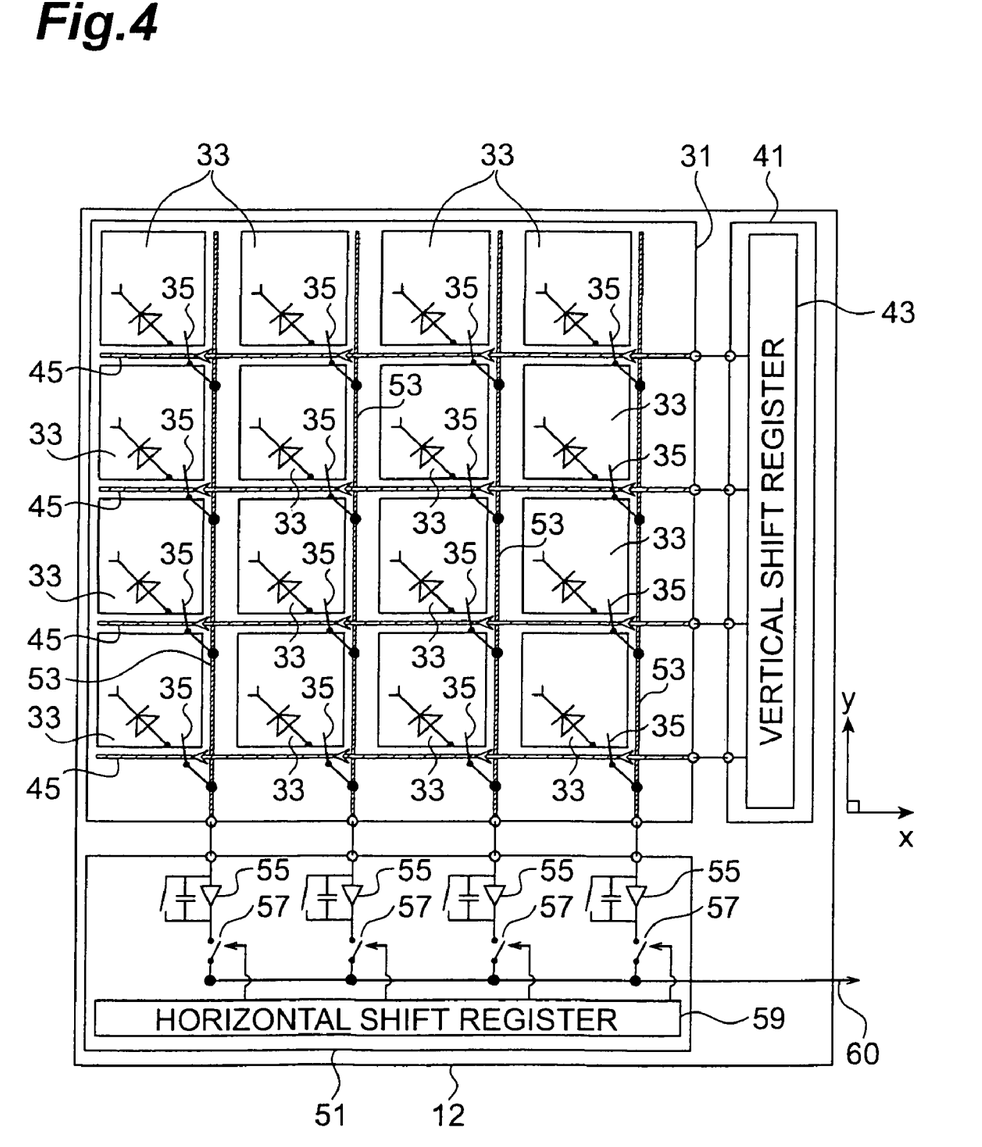
FIG. 4 is a configuration diagram showing the radiographic imaging apparatus according to the embodiment of the present invention.

FIGS. 1 and 2 are schematic views for explaining a cross-sectional configuration of the radiographic imaging apparatus according to the present embodiment, and FIG. 3 is a plan view showing the radiographic imaging apparatus according to the present embodiment. FIG. 4 is a configuration diagram showing the radiographic imaging apparatus according to the present embodiment. FIG. 3 is depicted without illustration of bonding wires.

The radiographic imaging apparatus 1 of the present embodiment, as shown in FIGS. 1 to 3, has a solid-state image sensor 11, a scintillator 21, a mount substrate 23, a frame 25, and others.

The solid-state image sensor 11 is an MOS image sensor, and has a photosensitive section 31, a shift register section 41, and an amplification section 51, which are formed on one side of a semiconductor substrate 12. In this manner, the photosensitive section 31, the shift register section 41, and the amplification section 51 are formed on the same substrate (semiconductor substrate 12). The semiconductor substrate 12 (solid-state image sensor 11) is fixed on the mount substrate 23. In the present embodiment, the area of the semiconductor substrate 12 is approximately 16900 mm$^2$ (=130 mm×130 mm), and the area of the photosensitive section 31 approximately 15625 mm$^2$ (=125 mm×125 mm).

The photosensitive section 31, as shown in FIG. 4, is constructed in a configuration wherein a plurality of photodiodes (photoelectric converters) 33 for storing charges according to intensities of incident light are arrayed in a two-dimensional pattern on the semiconductor substrate 12. More specifically, the photosensitive section 31 is composed of M×N photodiodes 33 arrayed in a matrix of M rows in the y-axis direction and N columns in the x-axis direction (M and N are natural numbers). In FIG. 4, M and N are determined to be "4."

Each of the photodiodes 33 forming the photosensitive section 31 is provided with a gate switch (switch forming a first switch group) 35 one end of which is electrically connected to the photodiode 33 and the other end of which is electrically connected to a signal readout line described later. Therefore, during an opening period of the gate switch 35, a charge is stored in the photodiode 33 with incidence of light, and the charge stored in the photodiode 33 is read out to the later-described signal readout line with closure of the gate switch 35. The gate switch 35 can be constructed of an MOSFET (field effect transistor).

The shift register section 41 includes a vertical shift register 43 and is formed so as to face one side of the photosensitive section 31, on the semiconductor substrate 12. The vertical shift register 43 outputs a vertical scan signal to open and close each gate switch 35.

A control terminal of each gate switch 35 is electrically connected to the vertical shift register 43 by a gate line (second wire) 45. In this configuration, each gate switch 35 can be opened and closed by a vertical scan signal outputted from the vertical shift register 43. Specifically, the gate lines 45 extend in the x-axis direction through portions between rows of photodiodes 33 arrayed in the photosensitive section 31, and each gate line 45 is connected to the control terminals of the respective gate switches 35 existing in one row. Accordingly, the vertical shift register 43 and the control terminals of the gate switches 35 are connected on a row-by-row basis.

Furthermore, N signal readout lines (first wires; signal lines) 53, to which the other ends of the gate switches 35 are electrically connected in each column, are provided between columns of photodiodes 33 arrayed in the photosensitive section 31. The N signal readout lines 53 are electrically connected to the amplification section 51. The amplification section 51 includes charge amplifiers 55, readout switches (switches constituting a second switch group) 57, a horizontal shift register 59, and so on. The amplification section 51 is formed so as to face one side adjacent to the one side of the photosensitive section 31 which the shift register section 41 is formed so as to face, on the semiconductor substrate 12.

The charge amplifiers 55 are provided for the respective signal readout lines 53, and amplify charges (electric current outputs), which is read out into the signal readout lines 53. The readout switches 57 are provided for the respective signal readout lines 53 and output the charges (electric current outputs), which is read out of the photodiodes 33, to a signal output line 60. The horizontal shift register 59 outputs a horizontal scan signal to open and close each readout switch 57.

A plurality of bonding pads 61 electrically connected to the amplifier section 51 are formed on the semiconductor substrate 12, as shown in FIGS. 2 and 3. These bonding pads 61 are electrically connected to corresponding bonding pads 65 formed on the mount substrate 23, by bonding wires 63. In this configuration, the outputs from the amplification section 51 are supplied via the mount substrate 23 to the outside of the imaging apparatus 1. A plurality of bonding pads 67 electrically connected to the shift register section 41 are formed on the semiconductor substrate 12 (particularly, cf. FIG. 3). These bonding pads 67 are electrically connected to corresponding bonding pads 69 formed on the mount substrate 23, by bonding wires (not shown). In this configuration, signals from the outside of the imaging apparatus 1 are supplied via the mount substrate 23 to the shift register section 41.

The scintillator 21 converts incident radiation (e.g., X-rays) to visible light and is of columnar structure. The scintillator 21, as also shown in FIG. 3, is arranged to cover the region where the photosensitive section 31, the shift register section 41, and the amplification section 51 are formed on one side of the semiconductor substrate 12, and is formed directly on the region. In this configuration, the scintillator 21 is arranged in contact with the region where the photosensitive section 31, the shift register section 41, and the amplification section 51 are formed on one side of the semiconductor substrate 12. The region where the bonding pads 61, 67 are formed on one side of the semiconductor substrate 12 is not covered by the scintillator 21, and is exposed.

A variety of materials can be used for the scintillator 21, and one of preferred materials is T1 (thallium) doped CsI, which demonstrates good luminous efficiency. A protective film (not shown) for hermetically sealing the scintillator 21 while covering the columnar structure of the scintillator 21 so as to fill its gaps is formed on the scintillator 21. The protective film is preferably a material that transmits radiation but shields against water vapor, e.g., poly-para-xylylene (trade name Parylene, available from Three Bond Co., Ltd.), and particularly preferably, poly-para-chloroxylylene (trade name Parylene C, available from the same company). In the present embodiment, the thickness of the scintillator 21 is approximately 300 μm.

The scintillator 21 can be formed by growing columnar crystals of CsI by deposition method. The protective film can be formed by CVD. The methods of forming the scintillator 21 and the protective film are disclosed in detail in PCT International Publication WO98/36290 filed by Applicant of the present application, for example, and the description thereof is omitted herein.

The frame 25 is fixed on the mount substrate 23 so as to surround the solid-state image sensor 11. The frame 25 has an opening 27 of rectangular shape formed at the position corresponding to the photosensitive section 31, and radiation is incident through the opening 27 to the scintillator 21. A space S is created between the frame 25, and the semiconductor substrate 12 and the mount substrate 23. The shift register section 41 and the amplification section 51 of the solid-state image sensor 11, the bonding pads 61, 65, the bonding wires 63, etc. are located inside the space S. Since the bonding wires 63 are placed inside the space S defined by the frame 25, the semiconductor substrate 12, and the mount substrate 23 as described above, the bonding wires 63 are protected from external physical stress, without being pushed by the frame 25. In addition, a shield 29 of a radiation-shielding material (e.g., lead or the like) is provided on the side opposite to the amplification section 51 side, on the frame 25, and the shield 29 well shields against radiation. In the present embodiment, the thickness of the shield 29 is approximately 2.5 mm.

Figure 5:
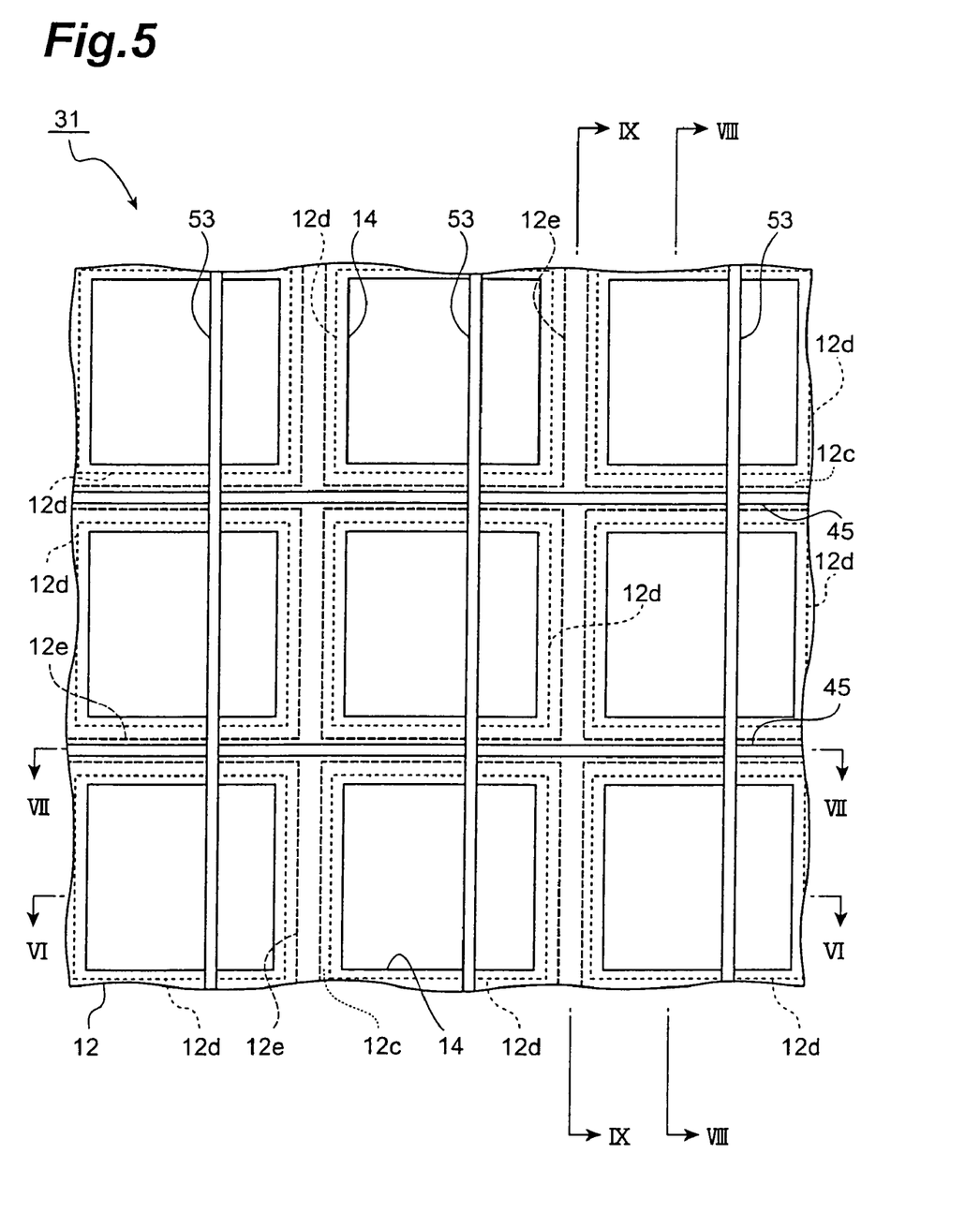
FIG. 5 is a plan view showing a photosensitive section included in a solid-state image sensor of the radiographic imaging apparatus according to the embodiment of the present invention.
Figure 6:
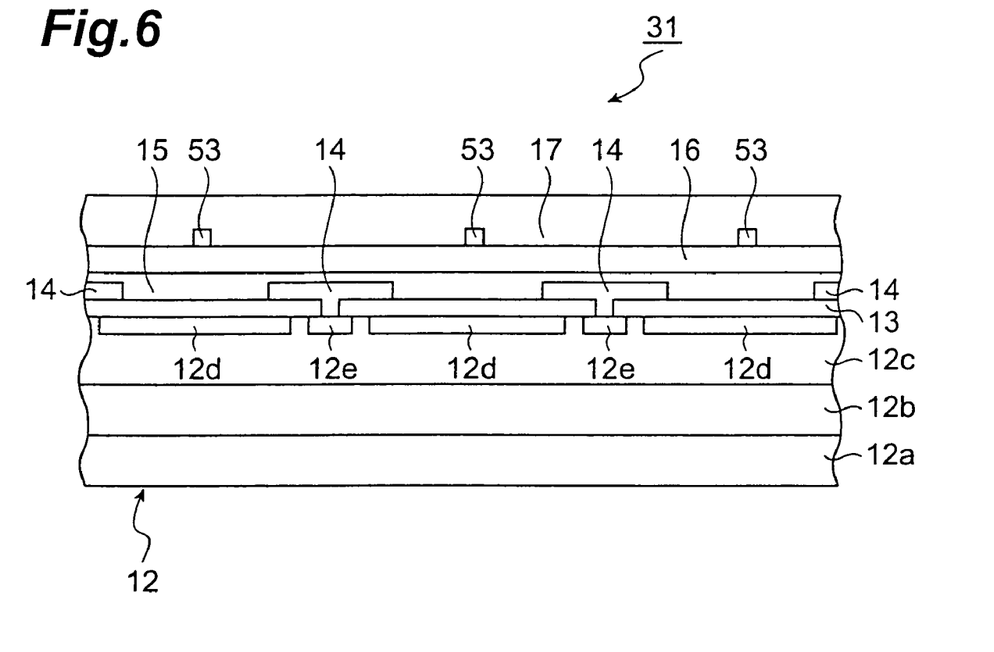
FIG. 6 is a schematic view for explaining a cross-sectional configuration along line VI-VI in FIG. 5.
Figure 7:
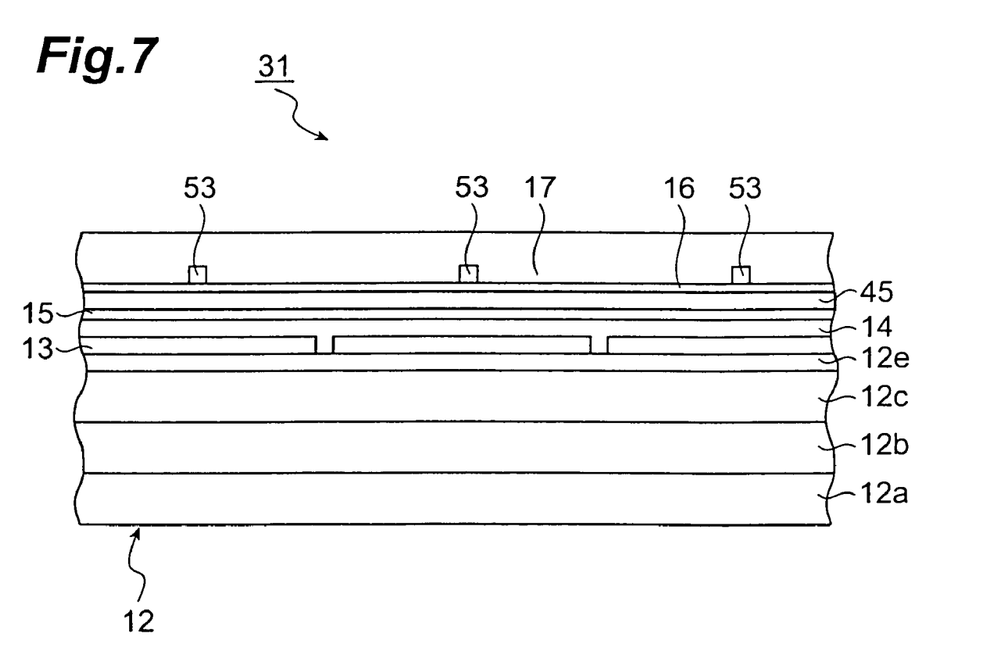
FIG. 7 is a schematic view for explaining a cross-sectional configuration along line VII-VII in FIG. 5.
Figure 8:
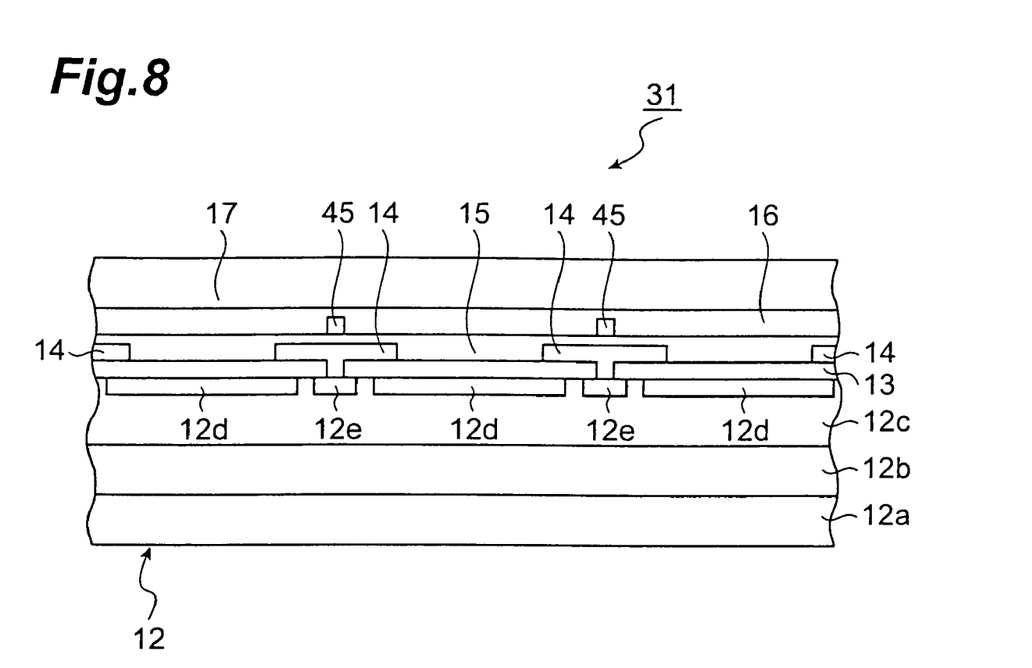
FIG. 8 is a schematic view for explaining a cross-sectional configuration along line VIII-VIII in FIG. 5.
Figure 9:
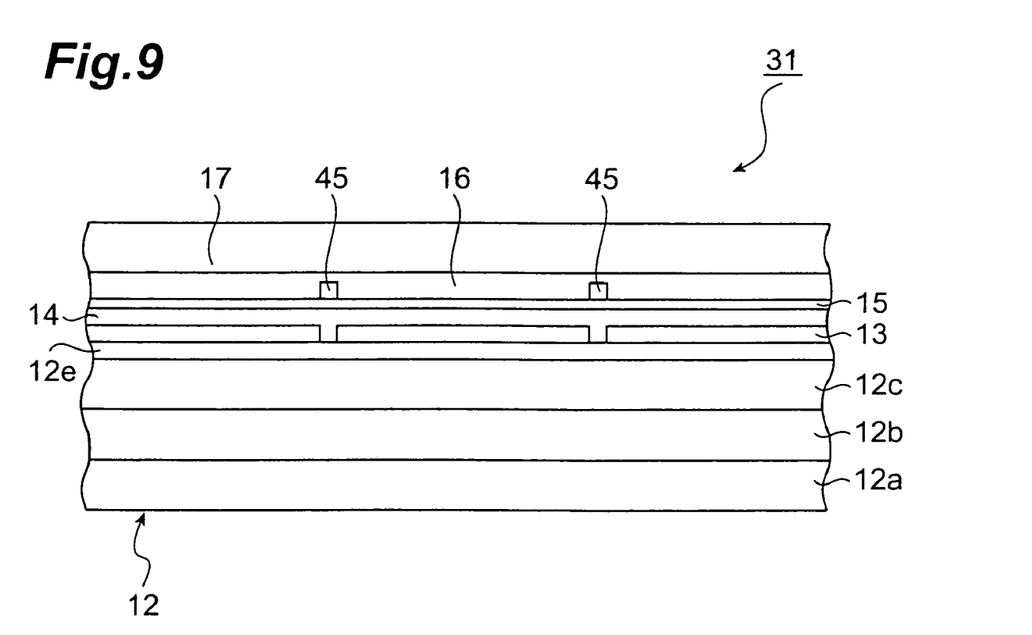
FIG. 9 is a schematic view for explaining a cross-sectional configuration along line IX-IX in FIG. 5.

Next, the configuration of the photosensitive section 31 will be described on the basis of FIGS. 5 to 9. FIG. 5 is a plan view showing the photosensitive section. FIG. 6 is a schematic view for explaining a cross-sectional configuration along line VI-VI in FIG. 5. FIG. 7 is a schematic view for explaining a cross-sectional configuration along line VII-VII in FIG. 5. FIG. 8 is a schematic view for explaining a cross-sectional configuration along line VIII-VIII in FIG. 5. FIG. 9 is a schematic view for explaining a cross-sectional configuration along line IX-IX in FIG. 5. FIG. 5 is depicted without illustration of first to fourth insulating layers 13, 15-17, and the gate switches 35.

The semiconductor substrate 12, as shown in FIGS. 6 to 9, includes a $p^+$-type semiconductor substrate $12a$, and a $p^-$-type epitaxial semiconductor layer $12b$ and a $p^-$-type layer $12c$ are formed on the $p^+$-type semiconductor substrate $12a$. The $p^+$-type semiconductor substrate $12a$ is set at the ground potential. The solid-state image sensor 11 is one using Si as a semiconductor; "high concentration" refers to the impurity concentration of not less than about $1\times10^{17}/cm^3$ and is expressed by "+" attached to the conductivity type; "low concentration" refers to the impurity concentration of not more than about $1\times10^{15}/cm^3$ and is expressed by "−" attached to the conductivity type.

$N^+$-type semiconductor regions $12d$ are formed on the front surface side of the $p^-$-type layer $12c$, and a pn junction composed of each $n^+$-type semiconductor ($n^+$-type semiconductor region $12d$) and the $p^-$-type semiconductor ($p^-$-type layer $12c$) constitutes a photodiode (photoelectric converter) 33. The $n^+$-type semiconductor regions $12d$ each are of rectangular shape when viewed from the direction of incidence of light, and are arrayed in a two-dimensional pattern of M rows and N columns, as shown in FIG. 5. In this configuration, the photodiodes 33 are arrayed in the two-dimensional pattern of M rows and N columns in the photosensitive section 31. In the present embodiment, the length on each side of the $n^+$-type semiconductor regions $12d$ is set to be approximately 50 μm.

An isolation region $12e$ of a $p^+$-type semiconductor is formed between adjacent $n^+$-type semiconductor regions $12d$ on the front surface side of the $p^-$-type layer $12c$. The isolation region $12e$, as shown in FIG. 5, extends along the row direction and along the column direction between adjacent $n^+$-type semiconductor regions $12d$ and is of grid shape when viewed from the direction of incidence of light.

A first insulating layer (e.g., made of a silicon oxide film) 13 is formed on the $p^-$-type layer $12c$, the $n^+$-type semiconductor regions $12d$, and the isolation region $12e$. A metal (e.g., aluminum) wire 14 is electrically connected to the isolation region $12e$ via through holes formed in the first insulating layer 13. The metal wire 14, as shown in FIG. 5, is provided so as to extend along the row direction and along the column direction between adjacent $n^+$-type semiconductor regions $12d$, and is of grid shape when viewed from the direction of incidence of light. In the present embodiment, the width of the metal wire 14 is set greater than the distance between adjacent $n^+$-type semiconductor regions $12d$, and part of the metal wire 14 overlaps the edges of $n^+$-type semiconductor regions $12d$ when viewed from the direction of incidence of light. The metal wire 14 is grounded and thus the isolation region $12e$ is set at the ground potential. The metal wire 14 may also be connected to a fixed potential, instead of being grounded.

A second insulating layer (e.g., made of a silicon oxide film) 15 is formed on the first insulating layer 13. The aforementioned gate lines 45 and a third insulating layer (e.g., made of a silicon oxide film) 16 are formed on the second insulating layer 15. The gate lines 45 are made of metal such as aluminum, and are provided so as to extend along the row direction and between adjacent $n^+$-type semiconductor regions $12d$.

The aforementioned signal readout lines 53 and a fourth insulating layer (e.g., made of a silicon oxide film) 17 are formed on the third insulating layer 16. The signal readout lines 53 are made of metal such as aluminum, and, as shown in FIGS. 5 and 6, the signal readout lines 53 are located above the $n^+$-type semiconductor regions $12d$ when viewed from the direction of incidence of light, and are provided so as to extend along the column direction. In the present embodiment, the width of the signal readout lines 53 is set to be approximately 0.5 μm. The signal readout lines 53 are placed with deviation of approximately 1-20 μm from one side of $n^+$-type semiconductor regions $12d$, above the $n^+$-type semiconductor regions $12d$.

In the present embodiment, as described above, the signal readout lines 53 are located above the $n^+$-type semiconductor regions $12d$ constituting the photodiodes 33, and are thus separated from the portions between adjacent $n^+$-type semiconductor regions $12d$, i.e., from the metal wire 14. This reduces the parasitic capacitance of the signal readout lines 53 and thus suppresses generation of noise, thereby improving the SN ratio.

Since the signal readout lines 53 are located above the $n^+$-type semiconductor regions $12d$, the photosensitivity of the photodiodes 33 becomes lower (by about 1.6% in the present embodiment) than that in a configuration wherein the signal readout lines 53 are located between adjacent $n^+$-type semiconductor regions $12d$. However, this decrease of the photosensitivity can be compensated for by a technique of enhancing the amplification rate in the amplification section 51, or the like, whereby a decrease of image output can be prevented as a result.

In order to reduce the parasitic capacitance of the signal readout lines 53, it is preferable to increase the deviation amount from one side of $n^+$-type semiconductor regions $12d$ (the portions between adjacent $n^+$-type semiconductor regions $12d$), e.g., to place the signal readout lines 53 in the central portion of the $n^+$-type semiconductor regions $12d$ when viewed from the direction of incidence of light. However, such large deviation from one side of $n^+$-type semiconductor regions $12d$ is not practical, because the signal readout lines 53 need to be connected to the gate switches 35 (MOSFETs). For this reason, the aforementioned deviation amount is preferably set in consideration of the decrease amount of the parasitic capacitance and connectivity to the gate switches 35.

The present invention is by no means limited to the above embodiment. The scintillator 21 is formed directly on the semiconductor substrate 12 in the present embodiment, but the structure is not limited to this. For example, it is also possible to adopt a configuration wherein a scintillator substrate is formed by laying a scintillator on a radiation-transmitting substrate and wherein the scintillator substrate is arranged so as to keep the scintillator in contact with the region where the photosensitive section 31, the shift register section 41, and the amplification section 51 are formed on one side of the semiconductor substrate 12. In a case where a protective film is formed on the scintillator, the protective film is brought into contact with the region where the photosensitive section 31, the shift register section 41, and the amplification section 51 are formed.

INDUSTRIAL APPLICABILITY

The solid-state imaging apparatus and the radiographic imaging apparatus of the present invention are applicable to radiographic imaging systems of large area, particularly, used in medical and industrial X-ray photography.

The invention claimed is:

1. A solid-state imaging apparatus comprising:
a plurality of photoelectric converters arrayed in a two-dimensional pattern;
signal lines for reading out outputs from the photoelectric converters, which are electrically connected to the photoelectric converters,
wherein the signal lines are provided for respective columns of the photoelectric converters and extend along a direction of the columns, and located above the photoelectric converters so as to be apart from portions extending along the direction of the columns and between the photoelectric converters adjacent to each other and intersect with the photoelectric converters when viewed from a direction of incidence of light.

2. The solid-state imaging apparatus according to claim 1, further comprising:
a switch group consisting of a plurality of switches for controlling electrical connection and disconnection between each photoelectric converter and the signal line in each column of the photoelectric converters; and
wires connected to control terminals of the respective switches constituting the switch group and arranged to supply to the control terminals a scan signal to turn each switch off or on in each row of the photoelectric converters,
wherein the wires are provided so as to extend along a direction of rows of the photoelectric converters and between the photoelectric converters adjacent to each other.

3. A solid-state imaging apparatus comprising:
a plurality of photoelectric converters arrayed in a matrix of M rows and N columns;
first wires provided for the respective columns;
a first switch group consisting of a plurality of switches connecting between each photoelectric converter and the first wire in each column;
a vertical shift register for outputting a vertical scan signal to open and close each switch forming the first switch group, in each row;
second wires for connecting between a control terminal of each switch forming the first switch group, and the vertical shift register in each row;
a second switch group consisting of a plurality of switches connecting between each first wire and a signal output line; and
a horizontal shift register for outputting a horizontal scan signal to open and close each switch forming the second switch group, in each column,
wherein the first wires are provided so as to extend along a direction of the columns, and located above the photoelectric converters so as to be apart from portions extending along the direction of the columns and between the photoelectric converters adjacent to each other and intersect with the photoelectric converters when viewed from a direction of incidence of light, and
wherein the second wires are provided so as to extend along a direction of the rows and between the photoelectric converters adjacent to each other.

4. A radiographic imaging apparatus comprising: the solid-state imaging apparatus as set forth in any one of claims 1 to 3; and a scintillator for converting radiation to visible light, which is provided so as to cover the plurality of photoelectric converters.

5. The solid-state imaging apparatus according to claim 1, further comprising:
an isolation region provided so as to extend along the direction of the columns and rows and between the photoelectric converters adjacent to each other;
a metal wire electrically connected to the isolation region and set at a reference potential; and
wherein the metal wire is provided so as to extend along the direction of the columns and rows, and located above the isolation region so as to overlap edges of the photoelectric converters when viewed from the direction of incidence of light, and
wherein the signal lines are located so as to be apart from portions extending along the direction of the columns in the isolation region when viewed from the direction of incidence of light.

* * * * *

UNITED STATES PATENT AND TRADEMARK OFFICE
CERTIFICATE OF CORRECTION

PATENT NO.       : 7,276,683 B2                                                Page 1 of 1
APPLICATION NO. : 10/536319
DATED            : October 2, 2007
INVENTOR(S)      : Mori et al.

It is certified that error appears in the above-identified patent and that said Letters Patent is hereby corrected as shown below:

On the title page of the patent, insert the following:

Item --[30]     Foreign Application Priority Data

Nov. 28, 2002   [JP]    Japan ..................... 2002-346247--

Signed and Sealed this

First Day of April, 2008

JON W. DUDAS
*Director of the United States Patent and Trademark Office*